United States Patent
Li et al.

(10) Patent No.: US 7,341,915 B2
(45) Date of Patent: Mar. 11, 2008

(54) METHOD OF MAKING PLANAR DOUBLE GATE SILICON-ON-INSULATOR STRUCTURES

(75) Inventors: Philip Li, Scottsdale, AZ (US); Suman K. Banerjee, Chandler, AZ (US); Thuy B. Dao, Austin, TX (US); Olin L. Hartin, Chandler, AZ (US); Jay P. John, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 331 days.

(21) Appl. No.: 11/142,057

(22) Filed: May 31, 2005

(65) Prior Publication Data

US 2006/0270164 A1     Nov. 30, 2006

(51) Int. Cl.
*H01L 21/336* (2006.01)
*H01L 21/84* (2006.01)

(52) U.S. Cl. ............... 438/283; 438/151; 438/157; 438/284; 257/E21.421

(58) Field of Classification Search ............... 438/283, 438/284, 157, 197, 399, 151
See application file for complete search history.

(56) References Cited

U.S. PATENT DOCUMENTS

| | | | |
|---|---|---|---|
| 6,004,853 A * | 12/1999 | Yang et al. | 438/305 |
| 6,339,002 B1 | 1/2002 | Chan et al. | |
| 6,642,115 B1 * | 11/2003 | Cohen et al. | 438/283 |
| 7,141,476 B2 * | 11/2006 | Dao | 438/283 |
| 2004/0031979 A1 * | 2/2004 | Lochtefeld et al. | 257/233 |
| 2004/0197977 A1 * | 10/2004 | Deleonibus | 438/202 |

OTHER PUBLICATIONS

Van Meer and De Meyer (IMEC), "The Spacer/Replacer Concept: A Viable Route for Sub-100nm Ultrathin-Film Fully-Depleted SOI CMOS," IEEE-EDL vol. 23, No. 1, Jan. 2002, pp. 46-48.
Disclosure for Freescale U.S. Appl. No. 10/871,402 filed on Jun. 18, 2004.
Disclosure for Freescale U.S. Appl. No. 10/971,657 filed on Oct. 22, 2004.

* cited by examiner

*Primary Examiner*—Michael Trinh
(74) *Attorney, Agent, or Firm*—Ingrassia, Fisher & Lorenz, P.C.

(57) ABSTRACT

Methods are provided for forming a semiconductor device from a substrate comprising a bottom gate layer, a channel layer overlying the bottom gate layer, and a top gate structure formed over the channel layer. First, a hardmask comprising a first material interposed between a second material and a third material is deposited over a portion of the top gate structure. Then, the hardmask and top gate structure are encapsulated with an insulating material to form a spacer. A channel structure is formed from the channel layer, and the channel structure is disposed under the spacer. A bottom gate structure is formed from the bottom gate layer, and the bottom gate structure is disposed under the channel structure. Then, a source/drain contact is formed around the bottom gate structure.

18 Claims, 7 Drawing Sheets

METHOD OF MAKING PLANAR DOUBLE GATE SILICON-ON-INSULATOR STRUCTURES

FIELD OF THE INVENTION

The present invention generally relates to semiconductor devices, and, more particularly, to planar double gate silicon-on-insulator structures and methods of making the structures.

BACKGROUND OF THE INVENTION

As the semiconductor industry has continued to progress toward microdevices, complementary metal-oxide-semiconductor (CMOS) circuits have become increasingly more highly integrated. Consequently, the individual devices which are combined to form CMOS circuits have become increasingly smaller. In some instances, the scaling down of these devices has created a need for new technologies, as existing technologies have run into fundamental limitations that prevent the devices from being scaled down any further.

For example, in conventional metal-oxide-silicon field effect transistor ("MOSFET") devices in which a gate controls a channel and the channel provides a path between a source region and a drain region, the smaller dimensions of the channel may cause the source and drain regions to be too close to one another. As a result of the shortened distance, leakage current may flow between the source and drain regions. Additionally, the ability to control the gate may be decreased.

To address the above issues, double gate field effect transistors, typically fin-type field effect transistors ("finFET") have been used. FinFETs are capable of relatively high transconductance and improved short-channel effects and include two gate conductors that surround a non-planarized channel. To produce the desired finFET structure, a substrate is subjected to a manufacturing process that includes a complex series of steps, such as deposition, etching, and planarization steps, that provide suitable conductor, semiconductor, and insulating layers and form the appropriate components of the finFET structures therefrom.

Although finFETs are relatively effective when implemented into microdevices, they may be relatively costly and time-consuming to produce. As a result, manufacturers have begun exploring the use of other types of double gate devices, such as, for example, planar double gate devices. Planar double gate devices typically include a top gate, a bottom gate, and a channel interposed therebetween. Similar to finFETs, a complex series of manufacturing processes is used to produce planar double gate devices. These manufacturing processes, however, have presented certain drawbacks. For example, in some processes, the top and bottom gates may not be appropriately aligned to one another. In other instances, the gates may be of varying widths. In either case, device yield and performance may be significantly constrained, extra gate to source/drain overlap capacitance may occur, and/or loss of current drive may result.

Accordingly, it is desirable to have a high-performance semiconductor device that has appropriately aligned gate conductors that have uniform lengths. Additionally, it is desirable to have a method for manufacturing the semiconductor device that is relatively inexpensive and simple to manufacture. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
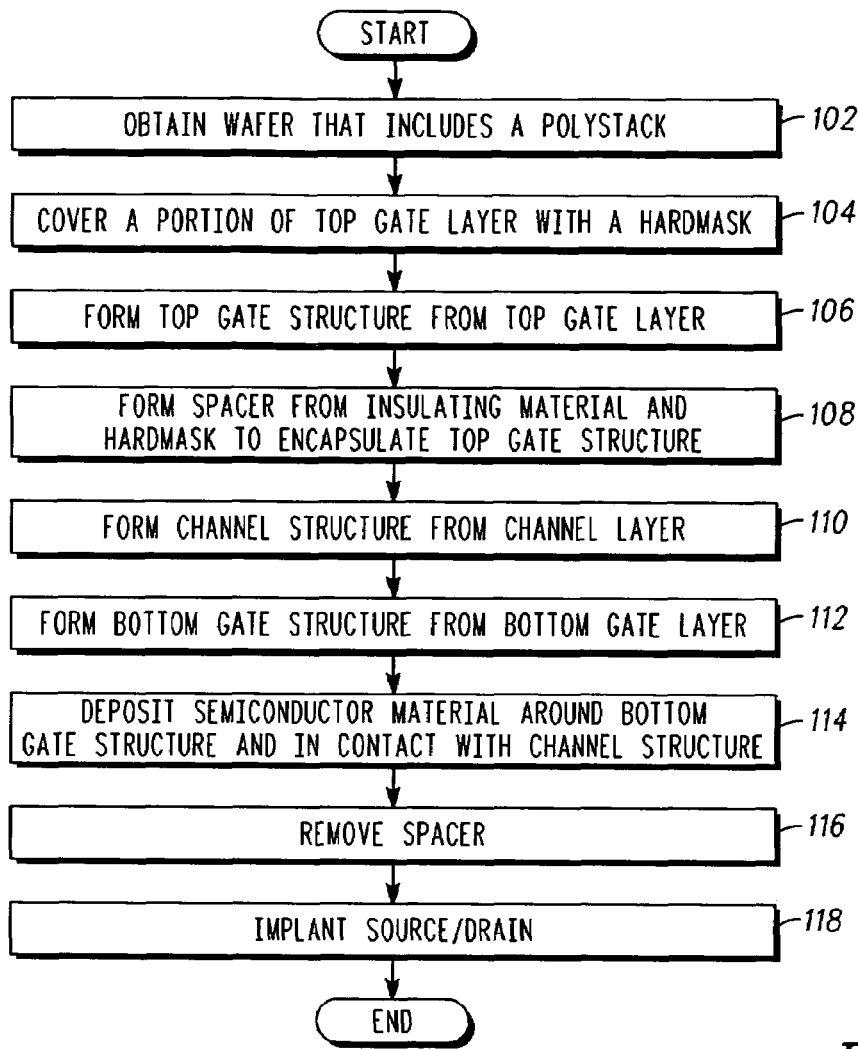
FIG. 1 is a flow chart diagram depicting an exemplary method for fabricating a semiconductor device.

FIG. 1 provides a flow chart of an exemplary method 100 for fabricating a semiconductor device. First, a substrate is obtained that includes a stack, or polygate stack, having an insulator layer, a bottom gate layer overlying the insulator layer, a bottom gate dielectric layer overlying the bottom gate layer, a channel layer overlying the bottom gate dielectric layer, a top gate dielectric layer overlying the channel layer, and a top gate layer overlying the top gate dielectric layer, step 102. Then, a portion of the top gate layer is covered with a hardmask, step 104. A portion of the hardmask and the top gate layer are removed to form a top gate structure, step 106. The top gate structure is encapsulated by and the hardmask is contacted with an insulating material to form a spacer, step 108. A channel structure is formed from the channel layer, step 110. A bottom gate structure is formed from the bottom gate layer and is substantially vertically in alignment with the top gate structure, step 112. Semiconductor material is deposited around the bottom gate structure and the spacer and in contact with the channel structure, step 114. Then, the spacer is removed to expose the top gate structure, step 116. Optionally, a source/drain is implanted into the semiconductor material, step 118.

Figure 2:
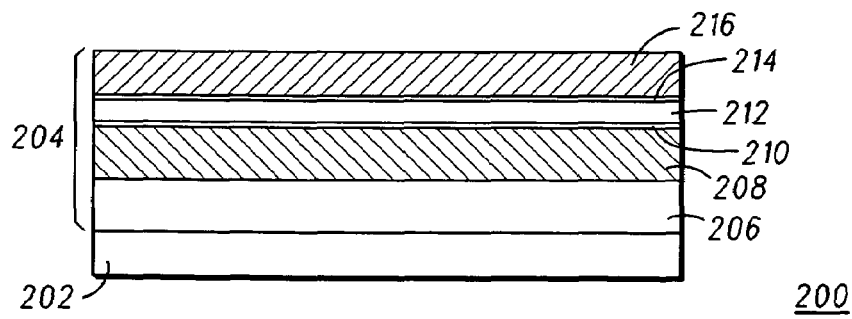
FIGS. 2-24 are simplified, cross section views of a substrate during various steps of the exemplary method depicted in FIG. 1.

As briefly mentioned above, the method 100 begins with a wafer 200 that includes a substrate 202 and polystack 204, as shown in FIG. 2. Wafer 200 may be manufactured elsewhere or processed as part of method 100.

If processed as part of method 100, substrate 202 is first obtained. Substrate 202 may comprise mono-crystalline silicon, or other types of semiconductor materials as are known to the art, including, for example, silicon carbon, silicon germanium, germanium, type III/V semiconductor materials, type II/VI semiconductor materials, and combinations thereof. Substrate 202 may also comprise multiple layers of different semiconductor materials.

Polystack 204 is disposed over substrate 202 and includes an insulator layer 206, a bottom gate layer 208, a bottom gate dielectric layer 210, a channel layer 212, a top gate dielectric layer 214, and a top gate layer 216. Each of these layers may be formed in any conventional manner.

In one exemplary embodiment, an insulator material is placed over substrate 202 to form insulator layer 206. The insulator material may be placed in any suitable manner, for example, by deposition or epitaxial growth. Additionally, it will be appreciated that any suitable insulator material may be used to form insulator layer 206, including, but not limited to conventionally used oxides, such as silicon oxide, nitrides, such as silicon nitride, or other materials, such as phosphorous silicate glass, fluorinated silicate glass, and/or any other dielectric material including high thermal, conductive dielectric materials. Moreover, substrate 202 may alternatively be the insulator material and may make up insulator layer 206. The insulator material is placed over or formed as part of substrate 202 at any conventional thickness, such as, for example, between about 10 nm and 1000 nm, and more preferably about 150 nm.

Then, material suitable for forming a gate is deposited over insulator layer 206 to form bottom gate layer 208. Suitable materials include conductive metals, which may be a pure metal or a metal alloy and semi-conductive materials. Some examples of possible gate metals include tungsten, tungsten silicon, tungsten titanium nitride, titanium, titanium nitride, titanium silicon, titanium silicon nitride, tantalum, tantalum silicon, tantalum nitride, tantalum silicon nitride, molybdenum, and other metals or combinations thereof. Examples of semi-conductive materials include, but are not limited to doped or undoped amorphous silicon or polysilicon, silicon germanium, and germanium. The gate material may also comprise multiple layers of conductive or semi-conductive materials. Preferably, bottom gate layer 208 is deposited to a thickness of between about 10 nm and about 1000 nm, and more preferably about 120 nm.

A dielectric material is then placed over insulator layer 206 to form bottom gate dielectric layer 210. The dielectric material may be any suitable material that acts as an insulator, such as, for example, silicon oxide or other dielectrics, including, for example, oxynitride, hafnium oxide, aluminum oxide, tantalum oxide, lantanium oxide, hafnium oxynitride, iridium oxynitride and/or other high K dielectric materials. Bottom gate dielectric layer 210 may be formed by a growing process, a deposition process, or through other suitable methods. Preferably, bottom gate dielectric layer 210 has a thickness of between about 0.01 nm and about 100 nm, more preferably about 4 nm.

Next, channel material is deposited over bottom gate dielectric layer 210 to form channel layer 212. The channel material may be a semi-conductive material, such as silicon, silicon germanium, or germanium, and may be deposited, grown, or otherwise placed over bottom gate dielectric layer 210. Channel layer 212 may have a thickness of between about 1 nm and about 500 nm, more preferably about 60 nm.

Channel layer 212 is insulated by top gate dielectric layer 214, which is formed by depositing, growing, or otherwise placing dielectric material over channel layer 212. It will be appreciated that any one of numerous suitable materials may be employed, such as those materials used to form bottom gate dielectric layer 210. Top gate dielectric layer 214 may comprise the same material or different material used to construct bottom gate dielectric layer 210. Preferably, top gate dielectric layer 214 has a thickness of between about 0.01 nm and about 100 nm, more preferably about 4 nm.

Gate material is then deposited over top gate dielectric layer 214 to form top gate layer 216. Top gate layer 216 may comprise any one of numerous suitable conductive or semi-conductive materials, including those materials used to form bottom gate layer 208. It will be appreciated that top gate layer 216 may or may not be formed of the same material than bottom gate layer 208. Top gate layer 216 preferably has a thickness of between about 10 nm and about 1000 nm, preferably about 120 nm.

Figure 3:
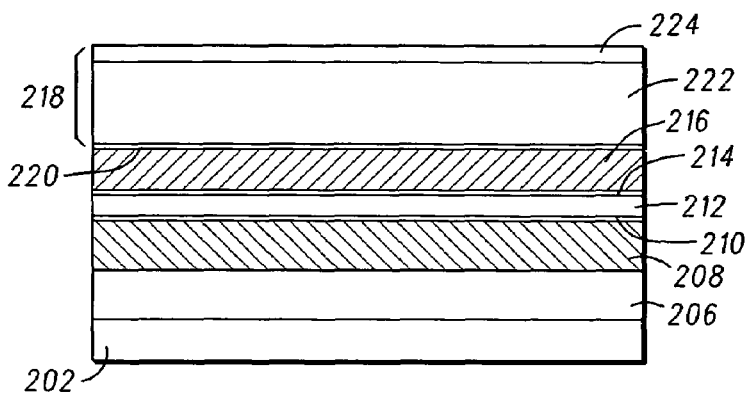

After wafer 200 is obtained, a portion of top gate layer 216 is covered with a hardmask, step 104. Hardmask 218 protects top gate layer 216 during subsequent etch and planarization processes and, as shown in FIG. 3, preferably comprises multiple layers 220, 222, and 224. First layer 220 and third layer 224 are preferably made from materials that differ from the material of second layer 222. The selection of each of the particular layer materials and deposition thicknesses of each layer may depend on the etch selectivities of the etchants to the various material layers in the following etching steps.

In one exemplary embodiment, both first and third layers 220 and 224 comprise oxide, for instance, conventionally used oxides, including, but not limited to TEOS. Preferably, first and third layers 220 and 224 comprise the same material; however, it will be appreciated that in some embodiments, layers 220 and 224 may alternatively comprise different materials. First layer 220 preferably has a thickness that is greater than the thickness of third layer 224. For example, first layer 220 may have a thickness of between about 1 nm and about 100 nm, more preferably about 25 nm, and third layer 224 may have a thickness of between about 5 nm and about 100 nm, more preferably a thickness that is about 10 nm less than that of first layer 220. Second layer 222 preferably comprises nitride, but may alternatively comprise any one of numerous other conventional material is suitable for protecting top gate layer 216, such as, for example, silicon dioxide. Second layer 222 preferably has a thickness that is greater than first and third layers 220 and 224, such as, for example, between about 10 nm and about 1000 nm, and more preferably about 200 nm. It will be appreciated that each of layers 220, 222, and 224 may be deposited or grown in any conventional manner.

Figure 4:
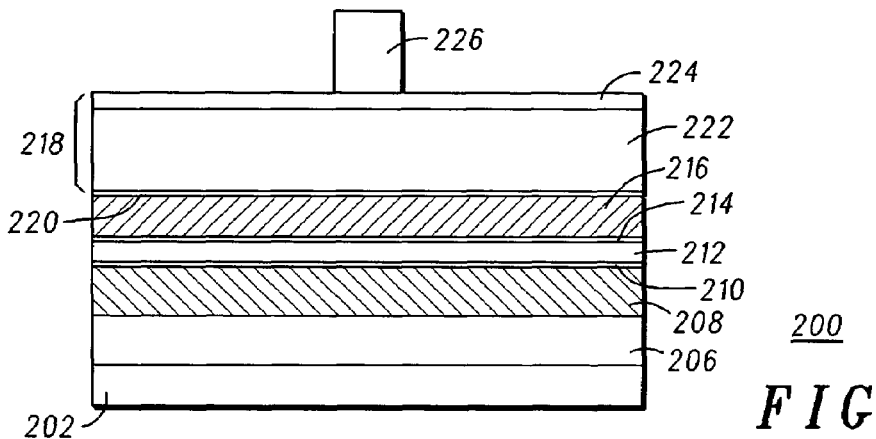
Figure 5:
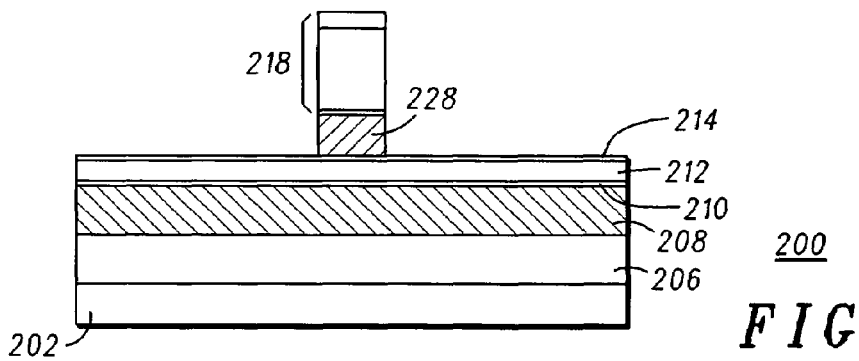

Next, a portion of hardmask 218 and top gate layer 216 are removed to form a top gate structure, step 106. Any one of numerous conventional methods to do so may be employed. In one exemplary embodiment, as depicted in FIGS. 4 and 5, a photoresist layer 226 is deposited over a selected portion of hardmask 218. Photoresist layer 226 may be placed over hardmask 218 in a predetermined pattern dependent on a desired resultant shape of the top gate structure. Areas of hardmask 218 and top gate layer 216 that are not protected by photoresist layer 226 are removed in any conventional manner, for example, etching. After photoresist layer 226 is removed, top gate structure 228 having hardmask 218 remains, as shown in FIG. 5.

It will be appreciated that steps 102, 104, and 106 may be combined or performed in any other sequence that yields top gate structure 228 having hardmask 218 deposited thereover. For example, top gate structure 228 may first be formed on wafer 200 in any conventional manner. Then, hardmask 218 may be subsequently deposited over top gate structure 228 in any suitable manner. In any case, hardmask 218 covers at least a portion of top gate structure 228.

Figure 6:
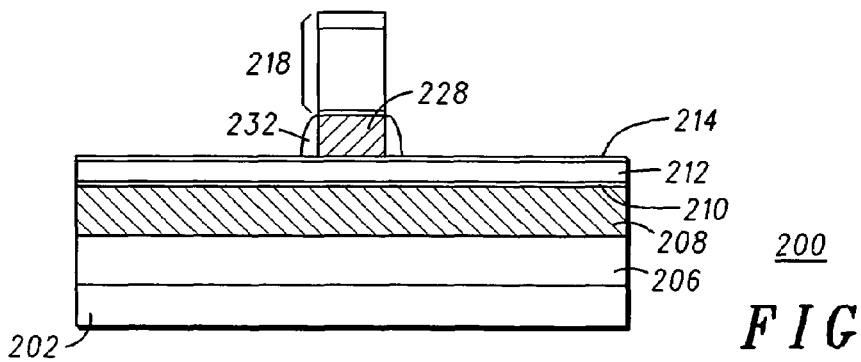
Figure 7:
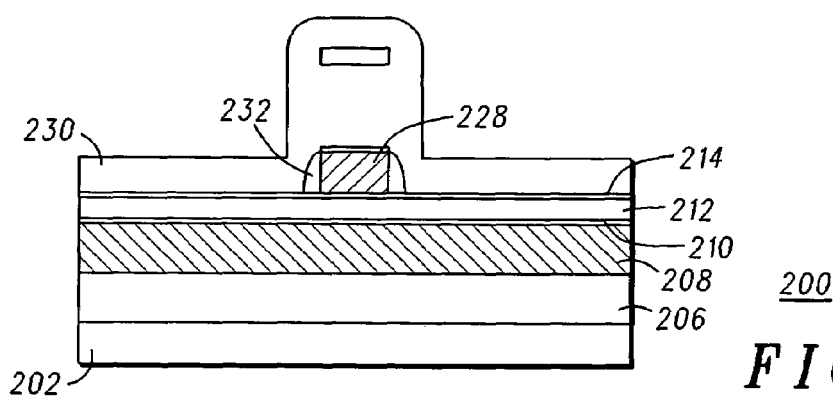
Figure 8:
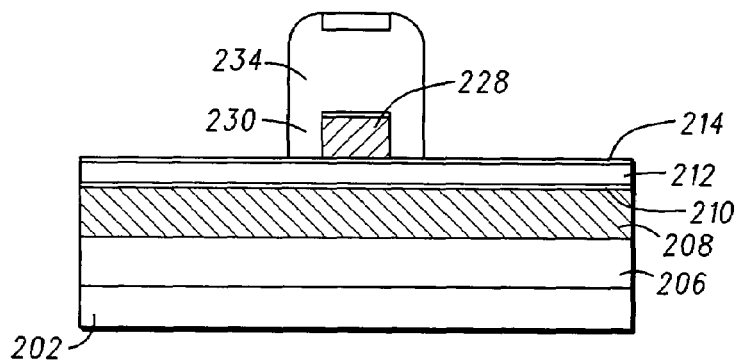

Top gate structure 228 is encapsulated by and hardmask 218 is contacted with an insulating material to form a spacer, step 108. Any one of numerous conventional manners for forming the spacer may be employed. One exemplary embodiment is depicted in FIGS. 6-8. First, as shown in FIG. 6, a passivating layer 232 is deposited on exposed portions of top gate structure 228 to protect top gate structure 228 from subsequent processes. Any conventional manner to deposit passivating layer 232 may be used, including, but not limited to rapid thermal processing, or a conventional furnace oxidation process. Additionally, any suitable passivating material may be used, however, the selection of and manner in which the particular material is used may be dependent on the top gate structure 228 material. For example, if the top gate structure 228 material is polysilicon, an oxide may be used for passivating layer 232. In another example, if the top gate structure 228 material is metal, oxide may also be employed, however passivating layer 232 may need to be formed by additional deposition and/or etching processes, instead of by a conventional furnace oxidation process. Any appropriate thickness of the passivating material may be deposited, for example, between about 1 nm and about 30 nm, preferably about 4 nm.

Insulating material 230, shown in FIG. 7, is then deposited over wafer 200. Preferably, insulating material 230 is deposited such that passivating layer 232 and top gate dielectric layer 214 are covered and a portion of hardmask 218, in particular, second layer 222, becomes incorporated as part of insulating material 230. In this regard, insulating material 230 and second layer 222 preferably comprise the same material; however, it will be appreciated that any suitable insulating material may alternatively be utilized. Insulating material 230 may have a thickness of between about 30 nm and about 300 nm insulating material, and more preferably about 100 nm.

Next, a portion of insulating material 230 is then selectively removed such that a dome-shaped spacer 234 is formed around top gate structure 228 and a majority of top gate dielectric layer 214 is exposed, as shown in FIG. 8. Insulating material 230 may be removed in any conventional manner, such as, for example, by reactive ion etching. Spacer 234 preferably has a desired thickness from top gate structure 228 to an external periphery of insulating material 230 of between about 10 nm and about 500 nm, more preferably about 100 nm.

Figure 9:
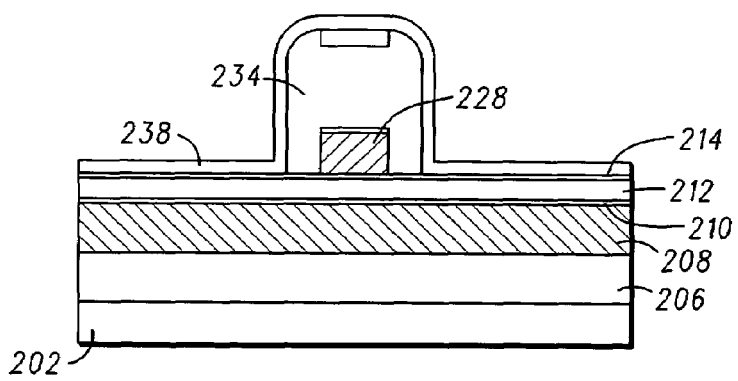
Figure 10:
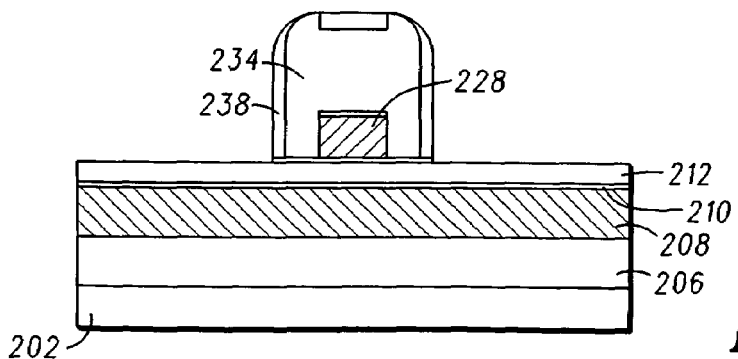
Figure 11:
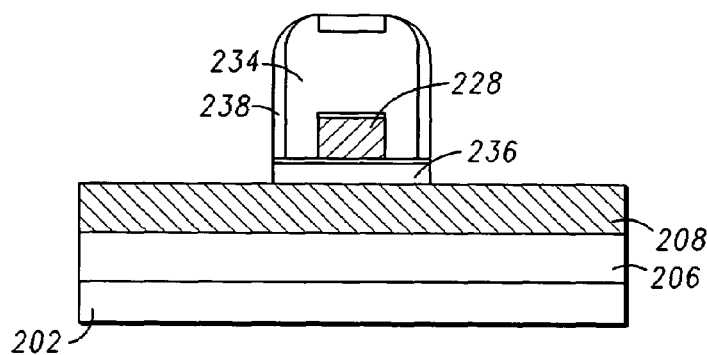

After step 109, a channel structure is formed from channel layer 212, step 110. In a preferred embodiment, channel structure 236 has a length that is greater than the width of spacer 234. In this regard, any one of numerous methods by which to form a suitable channel structure may be employed. One exemplary embodiment is shown in FIGS. 9-11. As shown in FIG. 9, a dielectric material is deposited or applied by a spin-on-process over channel layer 212 and exposed surfaces of top gate dielectric layer 214 and spacer 234 to form a dielectric layer 238 that merges with top gate dielectric layer 214. The dielectric material is preferably the same material as used for top gate dielectric layer 214, but may alternatively be any other suitable material having dielectric properties. Next, the dielectric material that overlies channel layer 212 and that surrounds spacer 234 is selectively removed, as shown in FIG. 10. It will be appreciated that any conventional method for removing dielectric material may be used, such as, for example, masking techniques and reactive ion etching. Then, a portion of channel layer 212 is removed to form channel structure 236, as shown in FIG. 11. In this regard, channel layer 212 material may be selectively etched or otherwise selectively removed.

Figure 12:
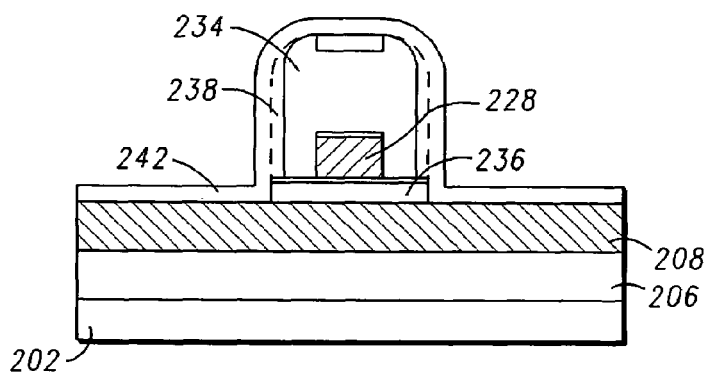
Figure 13:
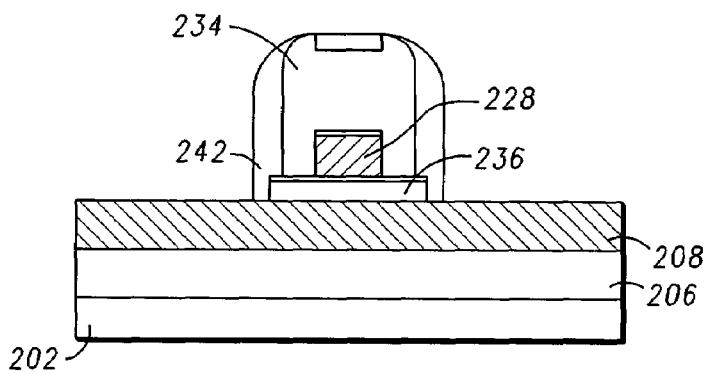

After channel structure 236 is formed, a bottom gate structure that is substantially vertically in alignment with the top gate structure 228 is formed from bottom gate layer 208, step 112. It will be appreciated that the bottom gate structure may be formed using any one of numerous methods, one example of which is depicted in FIGS. 12-16. As shown in FIG. 12, first, an insulating material 242 is deposited or applied by a spin-on-process over bottom gate layer 208 and to exposed surfaces of spacer 234, channel structure 236, and dielectric layer 238. Insulating material 242 may be any one of a number of appropriate materials, such as oxides, and in particular, TEOS. Preferably, however, insulating material is the same material as dielectric layer 238 so that insulating material 242 and dielectric material 238 may merge with one another when insulating material 242 is deposited thereover. Insulating material 242 may be deposited to a thickness of between about 10 nm and about 200 nm, preferably about 50 nm. Turning to FIG. 13, a first portion of insulating material 242 is selectively removed to expose a portion of bottom gate layer 208, while spacer 234 and channel structure 236 remain encapsulated by insulating material 242.

Figure 14:
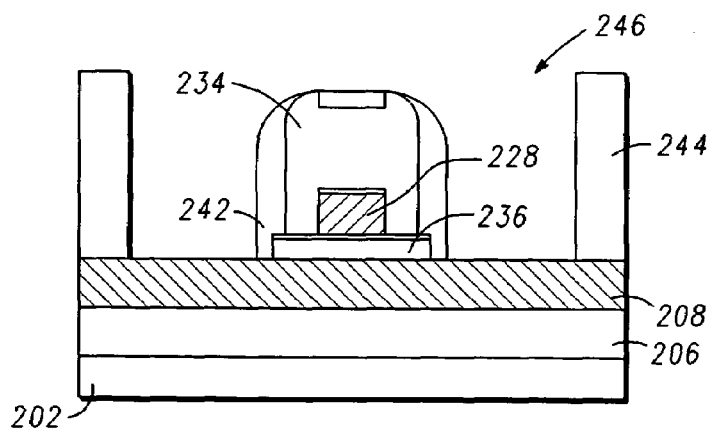
Figure 15:
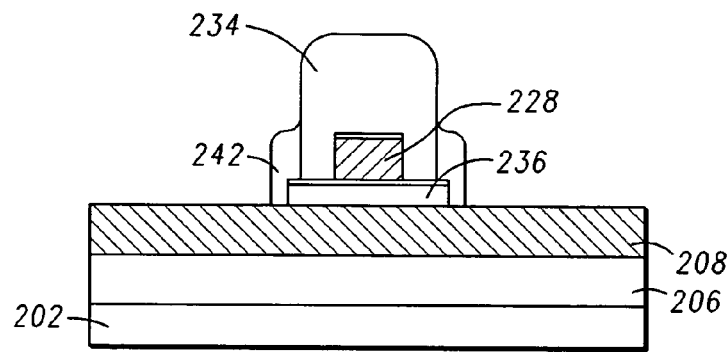
Figure 16:
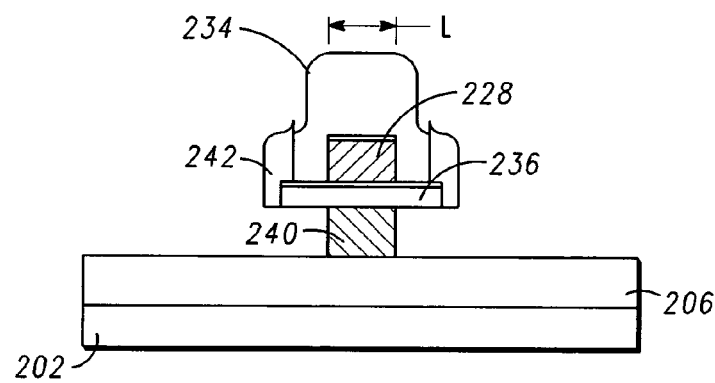

Optionally, to isolate active areas on which further processing may occur from other non-active areas, photoresist 244 may be coated over the nonactive areas, as shown in FIG. 14, to form an active cavity 246. Then, the first portion of insulating material 242 is removed, a second portion of insulating material 242 is removed such that the remaining insulating material 242 has a height that is substantially equal to a total height of channel structure 236 and top gate structure 228, as illustrated in FIG. 15. This step may be performed in any conventional manner, including, but not limited to, selective etching or electrochemical planarization. In another exemplary embodiment, a portion of spacer 234 is removed along with the aforementioned insulating material 242. In such case, etching compositions selective for insulating material 242 and spacer 234 are utilized for etching. Next, as shown in FIG. 16, bottom gate structure 240 is formed. In one exemplary embodiment, an anisotropic dry etching process is first employed to vertically etch bottom gate layer 208. Then, an isotropic dry etching process is utilized to laterally etch bottom gate layer 208 until bottom gate structure 240 is formed substantially vertically aligned with and having substantially the same width as the width L of top gate structure 228. In forming bottom gate structure 240, any combination of anisotropic dry etch and/or isotropic wet or dry etch processes may be utilized. It will be appreciated that any other suitable manner may be employed to form bottom gate structure 240 as well.

Figure 17:
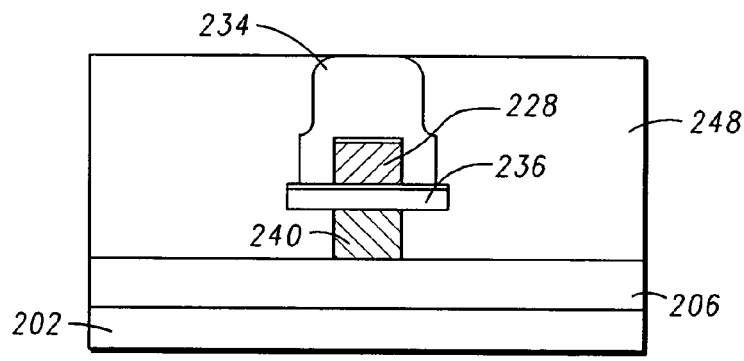
Figure 18:
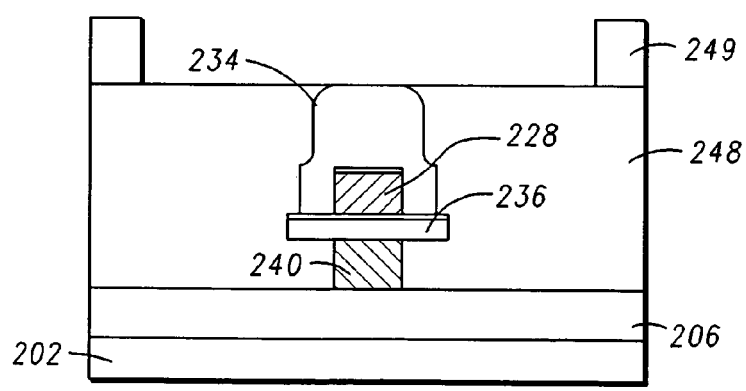
Figure 19:
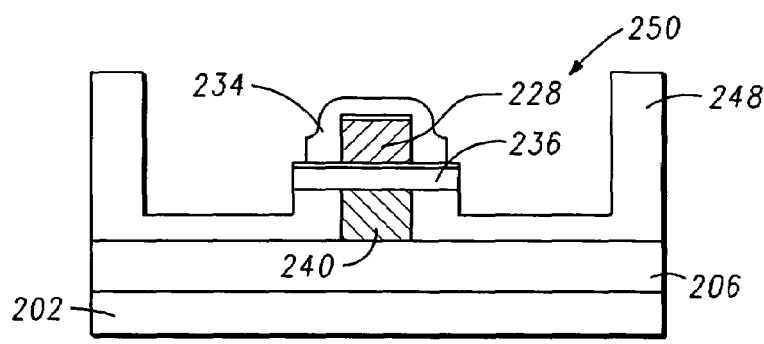

Subsequent to step 112, semiconductor material, or insulator material, is deposited around bottom gate structure 240 and spacer 234 and in contact with channel structure 236, step 114. This may be achieved in any one of numerous manners, one example of which is shown in FIGS. 17-21. Turning to FIG. 17, in a first step of the exemplary embodiment, an insulating material 248 that is substantially similar to insulating material 242 is deposited to surround bottom gate structure 240, cover spacer 234, and cover exposed portions of channel structure 236. Additionally, insulating material 248 is planarized until a top of the spacer 234 is exposed. A photoresist layer 249 is deposited over selected portions of insulating material 248, as shown in FIG. 18, such as, for example, by masking selected areas. Next, insulating material 248 that is not covered by photoresist layer 249 is removed to expose spacer 234 and edges of channel structure 236 to form a cavity 250, as shown in FIG. 19. Preferably, insulating material 248 around bottom gate structure 240 and under the channel structure 236 remains. Subsequently, photoresist layer 249 is stripped.

Figure 20:
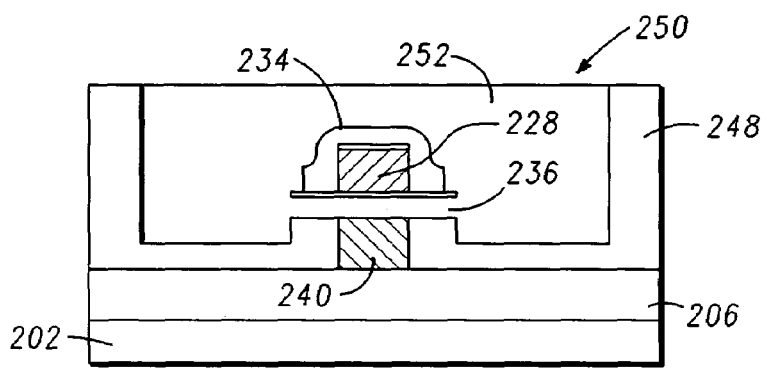
Figure 21:
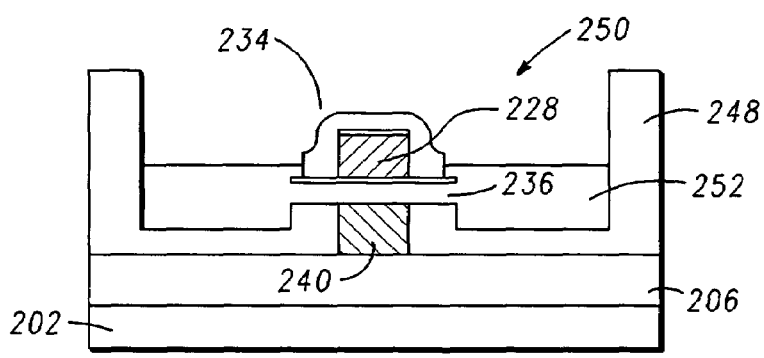
Figure 22:
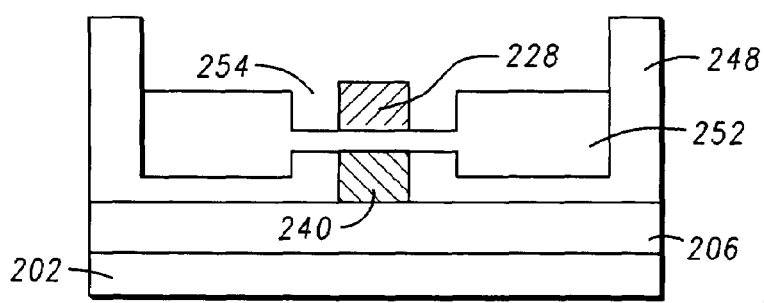

Next, cavity 250 may be transformed into a source/drain cavity. It will be appreciated that any conventional manner by which to form a source/drain cavity may be employed. One example is depicted in FIGS. 20-22. Turning to FIG. 20, semiconductor material 252 is first deposited into cavity 250 and subsequently planarized to produce a smooth surface. Semiconductor material 252 may be deposited in cavity 250 in any conventional manner and may, alternatively be epitaxially grown. Additionally, semiconductor material 252 is preferably the same material from which channel structure 236 is made; however, semiconductor material 252 may alternatively be any type of other suitable material, such as, for example, polysilicon, silicon, or metal that can be used as source/drain contacts for the semiconductor device. The polysilicon or silicon may be doped or undoped with typical source/drain dopants. Then, a portion of semiconductor material 252 is removed to expose spacer 234, as shown in FIG. 21. In a preferred embodiment, a bottom section of spacer 234 remains surrounded by semiconductor material 252. Any one of numerous conventional manners by which to remove semiconductor material 252 may be employed, such as, for example, selective etching, anisotropic dry etching, isotropic wet etching, or planarization. Alternatively, cavity 250 may be transformed into a source/drain cavity by epitaxially growing semiconductor material 252 off of channel structure 236.

After step 114, spacer 234 is removed, step 116. After spacer 234 is removed, top gate structure 228 is exposed and a recess 254 is formed in semiconductor material 252, as shown in FIG. 22. Spacer 234 may be removed in any one of numerous manners, which may be dependent on the material from which spacer 234 is made. For example, if spacer 234 comprises nitride, a wet etch process may be suitable to remove spacer 234.

Figure 23:
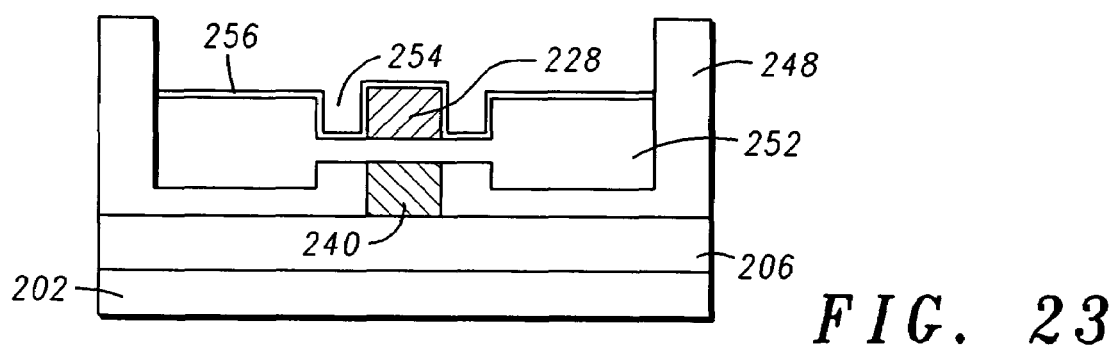
Figure 24:
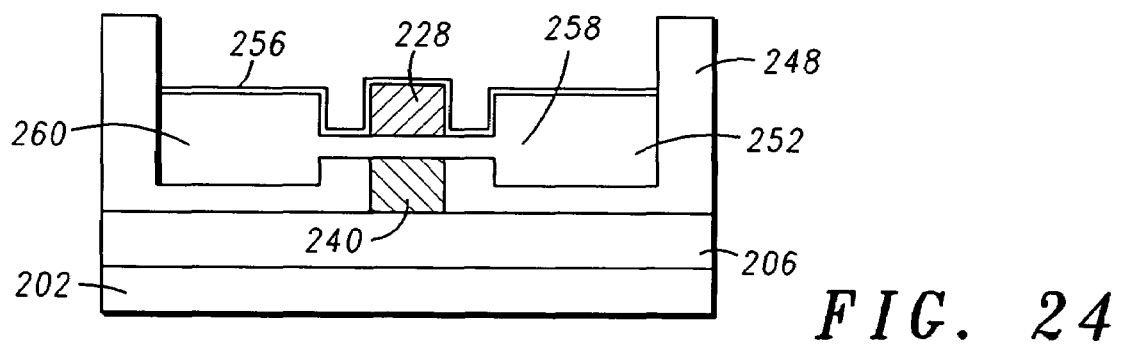

Next, source/drain dopants are implanted into the semiconductor material, step 118. In one exemplary embodiment of step 118, a passivating layer 256 is first deposited at a desired thickness to coat top gate structure 228 and semiconductor material 252, as shown in FIG. 23. Passivating layer 256 may be any one of numerous suitable materials for protecting top gate structure 228 and semiconductor material 252 from subsequent processing and may be deposited in any known manner. In another exemplary embodiment of step 118, after passivating layer 256 is deposited, a source/drain spacer is formed over passivating layer 256. In yet another exemplary embodiment of step 118, material for forming a source/drain spacer is deposited over top gate structure 228 and semiconductor material 252 and a source/drain spacer is formed from the deposited material. It will be appreciated that whether a passivating layer is deposited or whether a source/drain spacer is formed may depend upon the particular purpose of the resulting device. In any case, source/drain implants are made in semiconductor material 252 for forming source/drain regions 258 and 260, as shown in FIG. 24. It will be appreciated that source/drain regions 258 and 260 may be implanted in any conventional manner.

Methods are now provided for forming a semiconductor device from a substrate comprising a bottom gate layer, a channel layer overlying the bottom gate layer, and a top gate structure formed over the channel layer. First, a hardmask comprising a first material interposed between a second material and a third material is deposited over a portion of the top gate structure. Then, the hardmask and top gate structure are encapsulated with an insulating material to form a spacer. A channel structure is formed from the channel layer, and the channel structure is disposed under the spacer. A bottom gate structure is formed from the bottom gate layer, and the bottom gate structure is disposed under the channel structure. Then, a source/drain contact is formed around the bottom gate structure.

In another exemplary embodiment, the step of depositing a hardmask comprises covering a portion of the top gate structure with the second material, the second material comprising oxide, depositing the first material over the second material, the first material comprising nitride, and placing the third material over the first material, the third material comprising oxide. In still another exemplary embodiment, the step of encapsulating the hardmask and the top gate structure comprises placing insulating material over the top gate structure and incorporating the insulating material with the first material of the hardmask. In yet another exemplary embodiment, the step of encapsulating the hardmask and the top gate structure further comprises depositing a passivating layer on an exposed portion of the top gate structure, before the step of placing insulating material over the top gate structure. The step of depositing a passivating layer may comprise oxidizing the top gate structure. Alternatively, the substrate further comprises a top gate dielectric layer disposed over the channel layer and under the top gate structure, a portion of the insulating material is deposited over the top gate dielectric layer, and the step of encapsulating further comprises selectively removing the insulating material from the top gate dielectric layer to form the spacer.

In another exemplary embodiment, the substrate further comprises a top gate dielectric layer disposed over the channel layer and under the top gate structure, a portion of the insulating material is deposited over the top gate dielectric layer, and the step of forming a channel structure comprises depositing a dielectric material over the top gate dielectric layer and spacer.

In still another exemplary embodiment, the dielectric material merges with the top gate dielectric layer and the step of forming a channel structure further comprises removing a portion of the dielectric material overlying the channel layer and surrounding the spacer. A portion of the channel layer may be removed to form the channel structure. The step of forming a bottom gate structure may comprise forming the bottom gate structure substantially vertically in alignment with the top gate structure.

In another exemplary embodiment, the step of forming a bottom gate structure comprises depositing a second insulating material over at least a portion of the bottom gate layer, the spacer, and the channel structure. In another exemplary embodiment, the step of forming a bottom gate structure further comprises selectively removing a first portion of the second insulating material to expose a portion of the bottom gate layer while maintaining the spacer and channel structure encapsulated and removing a second portion of the second insulating material to expose a portion of the spacer. Alternatively, the step of forming a bottom gate structure may further comprise etching the bottom gate layer to form the bottom gate structure. In another embodiment, the step of etching the bottom gate layer may comprise anisotropically and isotropically etching the bottom layer.

In still another exemplary embodiment, the step of forming a source/drain contact comprises placing a third insulating material over the spacer and around the bottom gate structure, after the step of forming a bottom gate structure, forming a cavity in the third insulating material, and transforming the cavity into a source/drain cavity. The step of forming a source/drain contact may further comprise depositing semiconductor material in the source/drain cavity.

In yet another exemplary embodiment, the method may also further comprise depositing a dielectric over the top gate structure and semiconductor material.

In still yet another exemplary embodiment, a method of forming a semiconductor device from a substrate is provided where the substrate includes a polygate stack including an insulator layer, a bottom gate layer overlying the insulator layer, a bottom gate dielectric layer overlying the bottom gate layer, a channel layer overlying the bottom gate dielectric layer, a top gate dielectric layer overlying the channel layer, and a top gate layer overlying the top gate dielectric layer. First, the top gate layer is covered with a first material comprising oxide. Then, a second material comprising nitride is deposited over the first material. Next, a third material comprising oxide is placed over the second material. Portions of the first material, second material, third material are removed to form a hardmask. A portion of the top gate layer is removed to form the top gate structure. The top gate structure is encapsulated and the second material is contacted with an insulating material to form a spacer. A channel structure is formed from the channel layer. The channel structure is disposed under the spacer and has a width that is greater than a width of the top gate structure. A bottom gate structure is formed from the bottom gate layer that is substantially vertically in alignment with the top gate structure. Semiconductor material is deposited around the bottom gate structure and in contact with the channel structure. In one exemplary embodiment, the method further comprises removing the spacer to expose the top gate structure and implanting a source/drain into the semiconductor material.

In still another exemplary embodiment, a method is provided for forming a semiconductor device from a substrate comprising a polygate stack including an insulator layer, a bottom gate layer overlying the insulator layer, a bottom gate dielectric layer overlying the bottom gate layer, a channel layer overlying the bottom gate dielectric layer, a top gate dielectric layer overlying the channel layer, and a top gate layer overlying the top gate dielectric layer. The method includes the steps of forming a hardmask over the top gate layer by covering the top gate layer with a first material comprising oxide, depositing a second material comprising nitride over the first material, and placing a third material comprising oxide over the second material, shaping the hardmask by removing portions of the first material, second material, and third material, removing a portion of the top gate layer to form a top gate structure, encapsulating the top gate structure and contacting the second material with an insulating material to form a spacer, forming a channel structure from the channel layer, the channel structure disposed under the spacer and having a width that is greater than a width of the top gate structure, forming a bottom gate structure from the bottom gate layer that is substantially vertically in alignment with the top gate structure, depositing semiconductor material around the bottom gate structure and in contact with the channel structure, and forming a source/drain from the deposited semiconductor material.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a semiconductor device from a substrate comprising a bottom gate layer, a channel layer overlying the bottom gate layer, and a top gate structure formed over the channel layer, the method comprising:

depositing a hardmask comprising a first material interposed between a second material and a third material over a portion of the top gate structure;

encapsulating the hardmask and the top gate structure with an insulating material to form a spacer, said encapsulating comprising placing insulating material over the top gate structure, incorporating the insulating material with the first material of the hardmask, and depositing a passivating layer on an exposed portion of the top gate structure before placing the insulating material over the top gate structure;

forming a channel structure from the channel layer, the channel structure disposed under the spacer;

forming a bottom gate structure from the bottom gate layer, the bottom gate structure disposed under the channel structure; and forming a source/drain contact around the bottom gate structure.

2. The method of claim 1, wherein the step of depositing a hardmask comprises:

covering a portion of the top gate structure with the second material, the second material comprising oxide;

depositing the first material over the second material, the first material comprising nitride; and placing the third material over the first material, the third material comprising oxide.

3. The method of claim 1, wherein the step of depositing a passivating layer comprises oxidizing the top gate structure.

4. The method of claim 1, wherein the substrate further comprises a top gate dielectric layer disposed over the channel layer and under the top gate structure, a portion of the insulating material is deposited over the top gate dielectric layer, and the step of encapsulating further comprises selectively removing the insulating material from the top gate dielectric layer to form the spacer.

5. The method of claim 1, wherein the substrate further comprises a top gate dielectric layer disposed over the channel layer and under the top gate structure, a portion of the insulating material is deposited over the top gate dielectric layer, and the step of forming a channel structure comprises depositing a dielectric material over the top gate dielectric layer and spacer.

6. The method of claim 5, wherein the dielectric material merges with the top gate dielectric layer and the step of forming a channel structure further comprises removing a portion of the dielectric material overlying the channel layer and surrounding the spacer.

7. The method of claim 5, wherein a portion of the channel layer is removed to form the channel structure.

8. The method of claim 1, wherein the step of forming a bottom gate structure comprises forming the bottom gate structure substantially vertically in alignment with the top gate structure.

9. The method of claim 1, wherein the step of forming a bottom gate structure comprises depositing a second insulating material over at least a portion of the bottom gate layer, the spacer, and the channel structure.

10. The method of claim 9, wherein the step of forming a bottom gate structure further comprises:

selectively removing a first portion of the second insulating material to expose a portion of the bottom gate layer while maintaining the spacer and channel structure encapsulated; and removing a second portion of the second insulating material to expose a portion of the spacer.

11. The method of claim 10, wherein the step of forming a bottom gate structure further comprises etching the bottom gate layer to form the bottom gate structure.

12. The method of claim 11, wherein the step of etching the bottom gate layer comprises anisotropically and isotropically etching the bottom layer.

13. The method of claim 1, wherein the step of forming a source/drain contact comprises:
placing a third insulating material over the spacer and around the bottom gate structure, after the step of forming a bottom gate structure;
forming a cavity in the third insulating material; and
transforming the cavity into a source/drain cavity.

14. The method of claim 13, wherein the step of forming a source/drain contact further comprises depositing semiconductor material in the source/drain cavity.

15. The method of claim 14, further comprising depositing a dielectric over the top gate structure and the semiconductor material.

16. A method of forming a semiconductor device from a substrate comprising a polygate stack including an insulator layer, a bottom gate layer overlying the insulator layer, a bottom gate dielectric layer overlying the bottom gate layer, a channel layer overlying the bottom gate dielectric layer, a top gate dielectric layer overlying the channel layer, and a top gate layer overlying the top gate dielectric layer, the method comprising:
covering the top gate layer with a first material comprising oxide;
depositing a second material comprising nitride over the first material;
placing a third material comprising oxide over the second material;
removing portions of the first material, second material, and third material to form a hardmask;
removing a portion of the top gate layer to form a top gate structure;
encapsulating the top gate structure and contacting the second material of the hardmask with an insulating material to form a spacer, said encapsulating comprising placing insulating material over the top gate structure and depositing a passivating layer on an exposed portion of the top gate structure before placing the insulating material over the top gate structure;
forming a channel structure from the channel layer, the channel structure disposed under the spacer and having a width that is greater than a width of the top gate structure;
forming a bottom gate structure from the bottom gate layer that is substantially vertically in alignment with the top gate structure; and
depositing semiconductor material around the bottom gate structure and in contact with the channel structure.

17. The method of claim 16, further comprising
removing the spacer to expose the top gate structure; and
implanting a source/drain into the semiconductor material.

18. A method of forming a semiconductor device from a substrate comprising a polygate stack including an insulator layer, a bottom gate layer overlying the insulator layer, a bottom gate dielectric layer overlying the bottom gate layer, a channel layer overlying the bottom gate dielectric layer, a top gate dielectric layer overlying the channel layer, and a top gate layer overlying the top gate dielectric layer, the method comprising:
forming a hardmask over the top gate layer by:
covering the top gate layer with a first material comprising oxide;
depositing a second material comprising nitride over the first material; and
placing a third material comprising oxide over the second material;
removing portions of the first material, second material, and third material;
removing a portion of the top gate layer to form a top gate structure;
encapsulating the top gate structure and contacting the second material with an insulating material to form a spacer, said encapsulating comprising placing insulating material over the top gate structure and depositing a passivating layer on an exposed portion of the top gate structure before placing the insulating material over the top gate structure;
forming a channel structure from the channel layer, the channel structure disposed under the spacer and having a width that is greater than a width of the top gate structure;
forming a bottom gate structure from the bottom gate layer that is substantially vertically in alignment with the top gate structure;
depositing semiconductor material around the bottom gate structure and in contact with the channel structure; and
forming a source/drain from the deposited semiconductor material.

* * * * *